(12) United States Patent
Chiadambaram

(10) Patent No.: US 8,432,181 B2
(45) Date of Patent: Apr. 30, 2013

(54) METHOD AND APPARATUS FOR RECONFIGURABLE AT-SPEED TEST CLOCK GENERATOR

(75) Inventor: Dinakaran Chiadambaram, Sunnyvale, CA (US)

(73) Assignee: Thomson Licensing, Boulogne-Billacourt (FR)

( * ) Notice: Subject to any disclaimer, the term of this patent is extended or adjusted under 35 U.S.C. 154(b) by 378 days.

(21) Appl. No.: 12/737,428

(22) PCT Filed: Jul. 25, 2008

(86) PCT No.: PCT/US2008/009087
§ 371 (c)(1),
(2), (4) Date: Jan. 13, 2011

(87) PCT Pub. No.: WO2010/011208
PCT Pub. Date: Jan. 28, 2010

(65) Prior Publication Data
US 2011/0102010 A1    May 5, 2011

(51) Int. Cl.
*G01R 31/02* (2006.01)
*G01R 31/26* (2006.01)

(52) U.S. Cl.
USPC ............. 324/762.03; 324/76.53; 327/407; 327/201

(58) Field of Classification Search ............. 324/762.03, 324/76.53; 327/407, 201
See application file for complete search history.

(56) References Cited

U.S. PATENT DOCUMENTS

| | | | | |
|---|---|---|---|---|
| 4,697,279 A * | 9/1987 | Baratti et al. | ............. | 377/73 |
| 4,914,319 A * | 4/1990 | Hashimoto | ............. | 327/94 |
| 5,337,321 A * | 8/1994 | Ozaki | ............. | 714/731 |
| 5,357,146 A * | 10/1994 | Heimann | ............. | 327/292 |
| 5,606,565 A * | 2/1997 | Edler et al. | ............. | 714/727 |
| 5,652,536 A * | 7/1997 | Nookala et al. | ............. | 327/298 |
| 5,726,593 A * | 3/1998 | Ruuskanen | ............. | 327/99 |
| 5,811,995 A * | 9/1998 | Roy et al. | ............. | 327/99 |

(Continued)

FOREIGN PATENT DOCUMENTS

| KR | 2009-0055803 | 6/2009 |
|---|---|---|
| WO | WO2009-069958 | 6/2009 |

OTHER PUBLICATIONS

Chen et al., "Configurable Two-Dimensional Linear Feedback Shifter Registers for Parallel and Serial Built-In Self-Test", IEEE Transactions on Instrumentation and Measurement, vol. 53, No. 4, Aug. 2004, p. 1005-1014.*

(Continued)

*Primary Examiner* — Patrick Assouad
*Assistant Examiner* — Lamarr Brown
(74) *Attorney, Agent, or Firm* — Robert D. Shedd; Brian J. Cromarty

(57) ABSTRACT

A reconfigurable number of at-speed pulses and reconfigurable dead cycles between pulses is utilized to enhance test coverage of an Integrated Circuit. A reconfigurable number of programmable at-speed phase-locked loop clock pulses without a dead cycle is emitted through an integrated circuit. Further, a plurality of programmable at-speed phase-locked loop clock pulses is emitted through the Integrated Circuit such that a reconfigurable number of dead cycles is between the plurality of programmable at-speed phase locked loop clock pulses. In addition, data associated with the reconfigurable number of programmable at-speed phase-locked loop clock pulses is capture. Finally, data associated with the reconfigurable number of dead cycles is captured.

25 Claims, 4 Drawing Sheets

U.S. PATENT DOCUMENTS

| | | | |
|---|---|---|---|
| 5,821,781 A * | 10/1998 | Rigazio | 327/99 |
| 6,014,038 A * | 1/2000 | How et al. | 326/46 |
| 6,115,827 A * | 9/2000 | Nadeau-Dostie et al. | 713/503 |
| 6,131,173 A * | 10/2000 | Meirlevede et al. | 714/726 |
| 6,291,980 B1 * | 9/2001 | Aliahmad et al. | 324/76.82 |
| 6,393,592 B1 * | 5/2002 | Peeters et al. | 714/731 |
| 6,411,135 B2 * | 6/2002 | Komoto | 327/99 |
| 6,442,721 B2 * | 8/2002 | Whetsel | 714/726 |
| 6,479,978 B1 * | 11/2002 | Aliahmad et al. | 324/76.77 |
| 6,484,280 B1 * | 11/2002 | Moberly | 714/726 |
| 6,549,045 B1 * | 4/2003 | Wang et al. | 327/115 |
| 6,653,867 B1 * | 11/2003 | Shihadeh | 326/96 |
| 6,670,800 B2 * | 12/2003 | Beach et al. | 324/76.16 |
| 6,763,489 B2 * | 7/2004 | Nadeau-Dostie et al. | 714/731 |
| 6,784,699 B2 * | 8/2004 | Haroun et al. | 327/99 |
| 6,859,027 B2 * | 2/2005 | Li et al. | 324/76.53 |
| 6,882,184 B2 * | 4/2005 | Yamazaki | 327/99 |
| 7,046,047 B2 * | 5/2006 | Daijo | 327/99 |
| 7,196,554 B2 * | 3/2007 | Taskin et al. | 327/99 |
| 7,202,656 B1 * | 4/2007 | Gearhardt et al. | 324/76.53 |
| 7,239,190 B2 * | 7/2007 | Saeki | 327/299 |
| 7,259,598 B2 * | 8/2007 | Wu et al. | 327/99 |
| 7,403,058 B2 * | 7/2008 | Yeh et al. | 327/291 |
| 7,579,895 B2 * | 8/2009 | Sun et al. | 327/407 |
| 7,626,438 B2 * | 12/2009 | Mari et al. | 327/298 |
| 7,679,338 B2 * | 3/2010 | Goh et al. | 323/222 |
| 7,870,449 B2 * | 1/2011 | Waayers | 714/727 |
| 7,893,701 B2 * | 2/2011 | Arkin | 324/754.07 |
| 7,899,641 B2 * | 3/2011 | Fleury et al. | 702/120 |
| 2002/0118006 A1 * | 8/2002 | Enam et al. | 324/76.53 |
| 2003/0006750 A1 * | 1/2003 | Roberts et al. | 324/76.53 |
| 2003/0084390 A1 * | 5/2003 | Tamarapalli et al. | 714/744 |
| 2003/0145264 A1 * | 7/2003 | Siegel et al. | 714/726 |
| 2003/0155941 A1 * | 8/2003 | Byun et al. | 324/765 |
| 2003/0169070 A1 * | 9/2003 | West et al. | 326/38 |
| 2003/0184278 A1 * | 10/2003 | Li et al. | 324/76.53 |
| 2004/0061488 A1 * | 4/2004 | Rosenbaum et al. | 324/76.53 |
| 2004/0124903 A1 * | 7/2004 | Chaudhari | 327/407 |
| 2005/0022083 A1 * | 1/2005 | Wu | 714/726 |
| 2008/0133167 A1 * | 6/2008 | Fleury et al. | 702/120 |
| 2009/0051395 A1 * | 2/2009 | Goh et al. | 327/147 |
| 2009/0102452 A1 * | 4/2009 | Kam et al. | 324/76.53 |
| 2009/0160492 A1 * | 6/2009 | Hailu et al. | 327/99 |
| 2010/0213965 A1 * | 8/2010 | Chen | 324/765 |

OTHER PUBLICATIONS

Fan et al., "An On-Chip Test Clock Control Scheme for Multi-Clock At-Speed Testing", 16th IEEE Asian Test Symposium 2007, p. 341-346.*

Tan et al., "Phase Mismatch Detection and Compensation for PLL/DLL Based Multi-Phase Clock Generator", IEEE 2006 Custom Intergarated Circcuits Conference, 2006, p. 417-420.*

Furukawa et al., "A Novel and Practical Control Scheme for Inter-Clock At-Speed Testing", IEEE International Test Conference, 2006, p. 1-10.*

Lin et al., "High-Frequency, At-Speed Scan Testing", Mentor Graphics, Sep.-Oct. 2003, 2003, IEEE.

Wang et al., "The Design-for-Testability Features of a General Purpose Microprocessor", International Test Conference, Beijing, China, 2007 IEEE.

Search Report Dated Jun. 9, 2009.

* cited by examiner

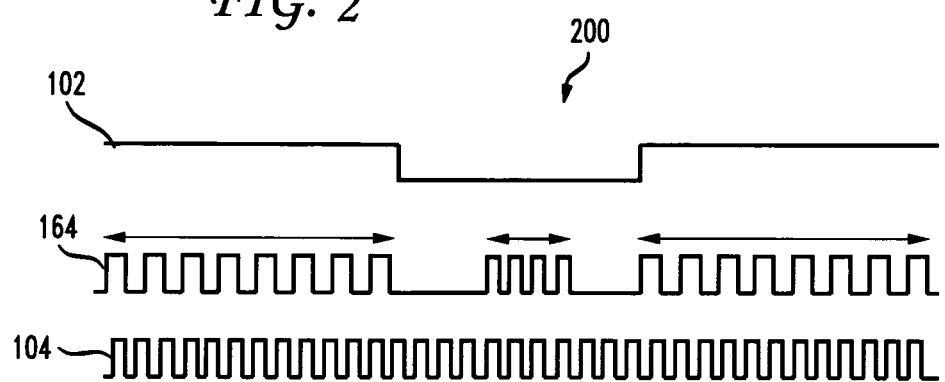
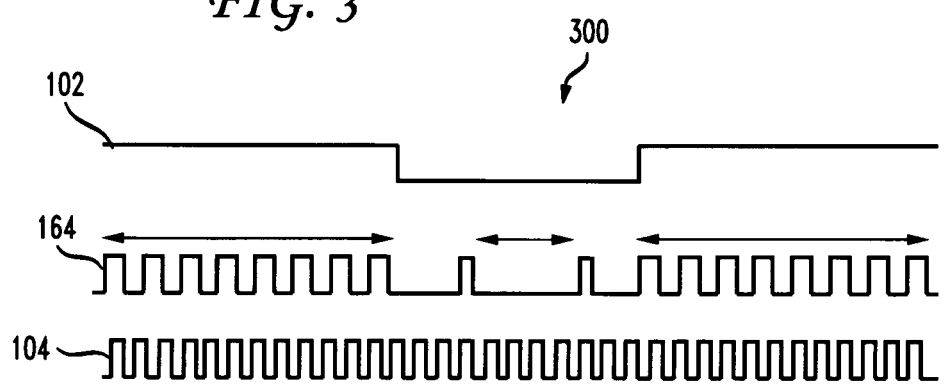

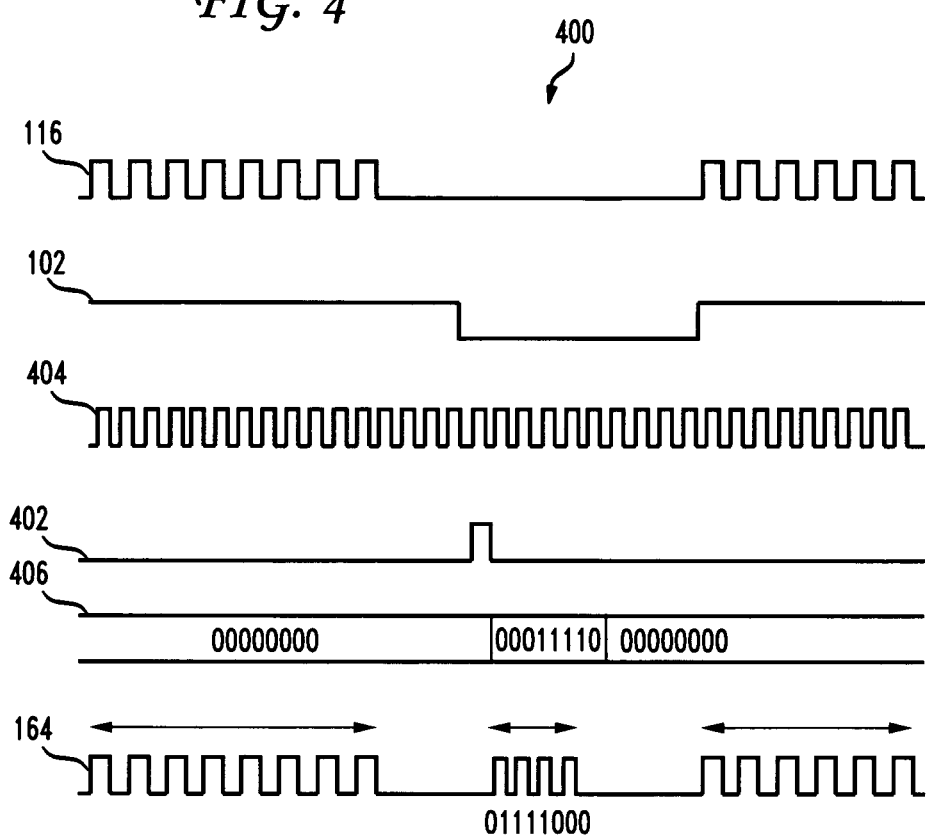

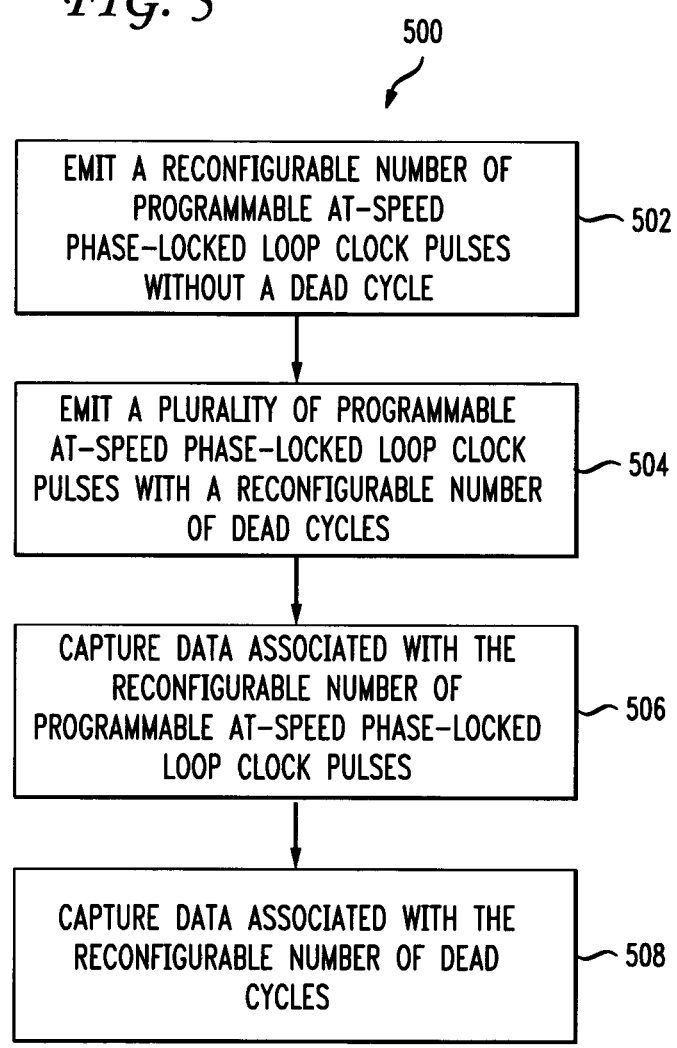

METHOD AND APPARATUS FOR RECONFIGURABLE AT-SPEED TEST CLOCK GENERATOR

This application claims the benefit, under 35 U.S.C. §365 of International Application PCT/US2008/009087, filed Jul. 25, 2008, which was published in accordance with PCT Article 21(2) on Jan. 28, 2010 in English.

BACKGROUND

1. Field

This disclosure generally relates to electronics. More particularly, the disclosure relates to Integrated Circuits ("ICs").

2. General Background

As the geometry of the transistor becomes smaller, current manufacturing processes are having difficulty adhering to the specifications for manufacturing the transistor. For example, a design of a transistor may utilize a particular timing, e.g., six hundred MHz. However, once the design of the IC is manufactured at a fabrication plant, the resulting IC may not meet the design specification of six hundred MHz. For example, the manufactured IC may have a timing of only five hundred seventy five MHz.

Accordingly, testing is performed to determine which path, or possibly paths, inside the manufactured IC does not meet the timing of the design specification. Utilizing the modern day pins inside the IC to perform the testing is ineffective because these pins can not run at the timing of the design specification. For example, the pins may run at three hundred MHz where as the timing of the design specification may be six hundred MHz. Price and technology limitations are contributing factors to the inefficacy of the pins in testing the IC.

Alternatively, utilizing the phase-locked loop ("PLL") clock inside the IC allows for testing that is commensurate with the timing of the design specification. As opposed to the pins that may run up to three hundred MHz, the PLL clock can run at a much higher speed such as six hundred MHz. As a result, the PLL clock can be utilized to test the IC at-speed, i.e., the full speed at which the IC is intended to run. However, current approaches do not effectively control the PLL to output only a few clock cycles so that the part of the IC not meeting the timing can be tested.

SUMMARY

In one aspect of the disclosure, a process is provided. The process emits a reconfigurable number of programmable at-speed phase-locked loop clock pulses without a dead cycle through an integrated circuit. Further, the process emits a plurality of programmable at-speed phase-locked loop clock pulses through the integrated circuit such that a reconfigurable number of dead cycles is between the plurality of programmable at-speed phase locked loop clock pulses. In addition, the process captures data associated with the reconfigurable number of programmable at-speed phase-locked loop clock pulses. Finally, the process captures data associated with the reconfigurable number of dead cycles.

In another aspect of the disclosure, a system is provided. The system includes a means for emitting a reconfigurable number of programmable at-speed phase-locked loop clock pulses without a dead cycle through an integrated circuit and emitting a plurality of programmable at-speed phase-locked loop clock pulses through the integrated circuit such that a reconfigurable number of dead cycles is between the plurality of programmable at-speed phase locked loop clock pulses. In addition, the system includes a means for capturing data associated with the reconfigurable number of programmable at-speed phase-locked loop clock pulse and capturing data associated with the reconfigurable number of dead cycles.

In yet another aspect of the disclosure, an apparatus is provided. The apparatus includes a clock that emits a reconfigurable number of programmable at-speed phase-locked loop clock pulses without a dead cycle through an integrated circuit and emits a plurality of programmable at-speed phase-locked loop clock pulses through the integrated circuit such that a reconfigurable number of dead cycles is between the plurality of programmable at-speed phase locked loop clock pulses. Further, the apparatus includes a data capture module that captures data associated with the reconfigurable number of programmable at-speed phase-locked loop clock pulses and data associated with the reconfigurable number of dead cycles.

DRAWINGS

The above-mentioned features of the present disclosure will become more apparent with reference to the following description taken in conjunction with the accompanying drawings wherein like reference numerals denote like elements and in which:

FIG. 2 illustrates a wave form view of the programmable at-speed PLL clock pulses shown in FIG. 1.

FIG. 3 illustrates a wave form view of the programmable at-speed PLL clock pulses with dead cycles shown in FIG. 1.

FIG. 4 illustrates a wave form view of the at-speed PLL clock pulses shown in FIG. 1 along with the other relevant signals.

FIG. 5 illustrates a process that may be utilized in the circuit configuration 100 shown in FIG. 1.

DETAILED DESCRIPTION

Figure 1:
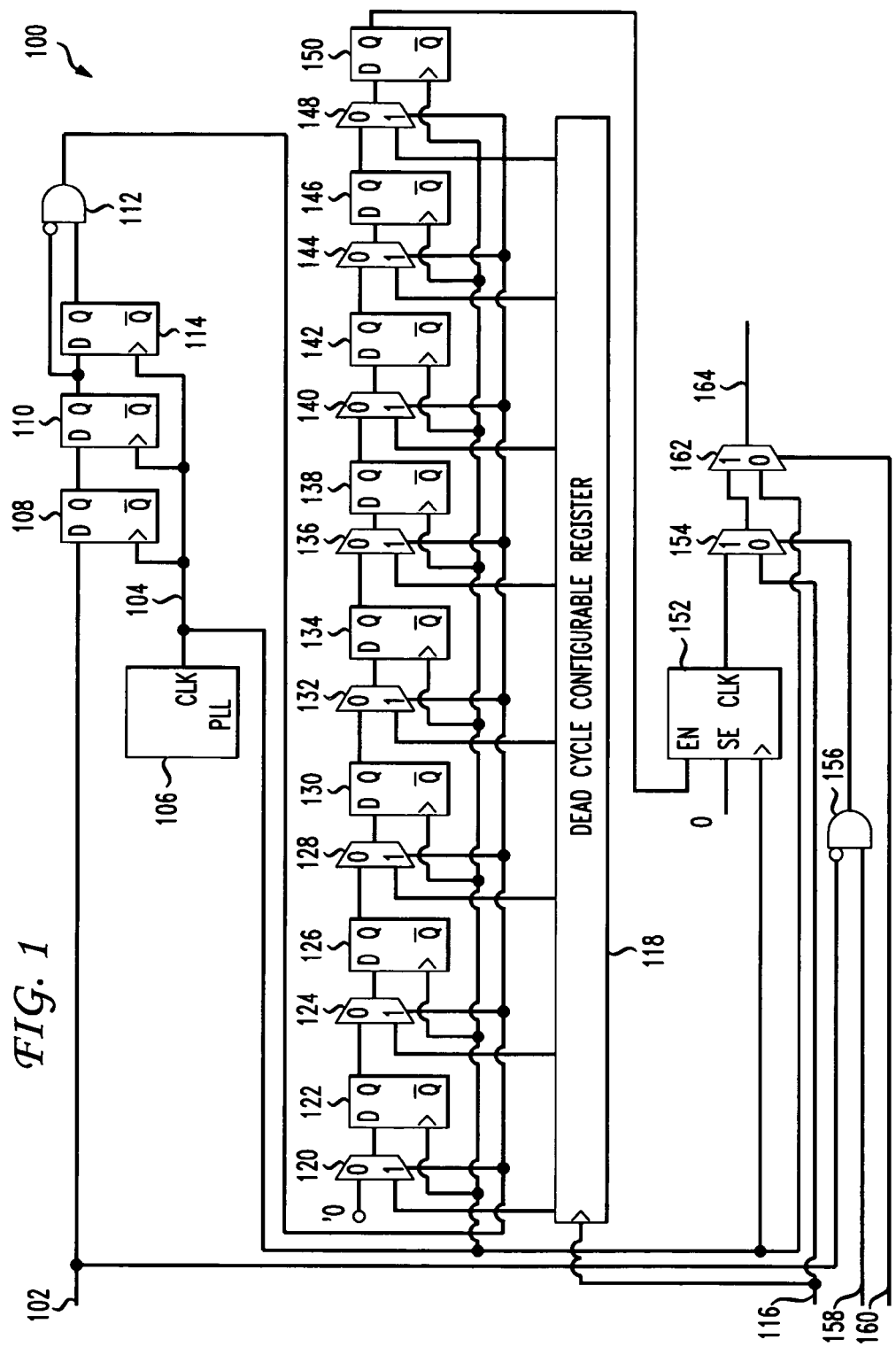
FIG. 1 illustrates a circuit configuration that utilizes the reconfigurable number of at-speed pulses and reconfigurable dead cycles during testing of an IC.

A method and apparatus may be utilized to enhance test coverage of an IC when testing path delay or transition faults in the IC. A reconfigurable number of at-speed pulses and reconfigurable dead cycles between pulses is utilized to enhance the test coverage. In particular, the test coverage in the same domain and the test coverage in a related clock domain may be enhanced.

FIG. 1 illustrates a circuit configuration 100 that utilizes the reconfigurable number of at-speed pulses and reconfigurable dead cycles during testing of an IC. A scan_enable signal 102 is provided along with a PLL clock signal 104 from a PLL clock 106 to a first flip-flop 108. Further, the output of the first flip-flop 106 is provided to a second flip-flop 110 along with the PLL clock signal 104 from the PLL clock 106. The output of the second flip-flop 110 is inverted and provided to an edge detector 112. In addition, the uninverted output of the second flip-flop 110 is provided to a third flip-flop 114 along with the PLL clock signal 104 from the PLL clock 106. An AND operation is then performed on the inverted output of the second flip-flop 110 and the output of the third flip-flop at the edge detector 112. The output of the edge detector 112 will be utilized as discussed below.

A scan_clk signal 116 is provided to a dead cycle configurable register 118. In one embodiment, the dead cycle configurable load register 118 may be utilized for multi-cycle paths and related clocks. Further, the dead cycle configurable load register 118 may be loaded with a separate scan chain or can be controlled utilizing primary input pins. As an example of the operation of the dead cycle configurable register 118, a first output may be provided to a first multiplexor 120 along with the output of the edge detector 112 and a low input.

The output of the multiplexor 120 is then provided along with the PLL clock signal 104 from the PLL clock 106 to a first configurable register 122. Further, a second output of the dead cycle configurable register 118 may then be provided to a second multiplexor 124 along with the output of the edge detector 112 and the output from the first configurable register 122. The output of the second multiplexor 124 is then provided along with the PLL clock signal 104 from the PLL clock 106 to the second configurable register 126. In addition, a third output of the dead cycle configurable register 118 may then be provided to a third multiplexor 128 along with the output of the edge detector 112 and the output from the second configurable register 126. The output of the third multiplexor 128 is then provided along with the PLL clock signal 104 from the PLL clock 106 to the third configurable register 130. A fourth output of the dead cycle configurable register 118 may then be provided to a fourth multiplexor 132 along with the output of the edge detector 112 and the output from the third configurable register 130. The output of the fourth multiplexor 132 is then provided along with the PLL clock signal 104 from the PLL clock 106 to the fourth configurable register 134. Further, a fifth output of the dead cycle configurable register 118 may then be provided to a fifth multiplexor 136 along with the output of the edge detector 112 and the output from the fourth configurable register 134. The output of the fifth multiplexor 136 is then provided along with the PLL clock signal 104 from the PLL clock 106 to the fifth configurable register 138. In addition, a sixth output of the dead cycle configurable register 118 may then be provided to a sixth multiplexor 140 along with the output of the edge detector 112 and the output from the fifth configurable register 138. The output of the sixth multiplexor 140 is then provided along with the PLL clock signal 104 from the PLL clock 106 to the sixth configurable register 142. A seventh output of the dead cycle configurable register 118 may then be provided to a seventh multiplexor 144 along with the output of the edge detector 112 and the output from the sixth configurable register 142. The output of the seventh multiplexor 144 is then provided along with the PLL clock signal 104 from the PLL clock 106 to the seventh configurable register 146. Finally, an eighth output of the dead cycle configurable register 118 may then be provided to an eighth multiplexor 148 along with the output of the edge detector 112 and the output from the seventh configurable register 146. The output of the seventh multiplexor 148 is then provided along with the PLL clock signal 104 from the PLL clock 106 to the eighth configurable register 150. The specific number of configurable registers described herein is provided solely for illustration purposes as a different number of configurable registers may be utilized. Further, a data capture module that includes the dead cycle configurable register 118 and some or all of the configurable registers, e.g., the first configurable register 122, the second configurable register 126, the third configurable register 130, the fourth configurable register 134, the fifth configurable register 138, the sixth configurable register 142, the seventh configurable register 146, and the eight configurable register 150, may be utilized to store the data during the testing of the IC.

The output from the seventh configurable register 150 is then provided along with a low input and an inverted form of the PLL clock signal 104 to a clock gating cell 152. The output of the clock gating cell is an at_speed_pll_clk signal. Further, the at_speed_pll_clk signal is provided to a multiplexor 154 along with the scan_clk signal 116 and an output from an AND gate 156 that receives an inverted form of the scan_enable signal 102 and an at_speed signal 158 as inputs. The output of the multiplexor 154 is then provided along with the PLL clock signal 104 from the PLL clock 106 and a test_mode signal 160 to a multiplexor 162. The output of the multiplexor 162 is the pll_clk signal 164.

FIG. 2 illustrates a wave form view 200 of the programmable at-speed PLL clock pulses shown in FIG. 1. The PLL clock signal 104 consistently moves through each of its cycles. While the scan_enable signal 102 is high, the pll_clk signal 164 is the scan_clk signal 116. However, when the scan_enable signal 102 is low, the pll_clk signal 164 includes one or more programmable at_speed_pll_clk pulses from the at_speed_pll_clk signal.

FIG. 3 illustrates a wave form view 300 of the programmable at-speed PLL clock pulses with dead cycles shown in FIG. 1. The PLL clock signal 104 consistently moves through each of its cycles. While the scan_enable signal 102 is high, the pll_clk signal 164 is the scan_clk signal 116 configured to be a shift clock. When the scan_enable signal 102 is low, the pll_clk signal 164 is configured as a capture clock to include one or more programmable at-speed dead cycles.

FIG. 4 illustrates a wave form view of the at-speed PLL clock pulses shown in FIG. 1 along with the other relevant signals. In particular, the scan_clk signal 116 is illustrated as having period in which it is low. During that period, the scan_enable signal 102 has a period in which it is low also. Specifically, the scan_enable signal 102 becomes low when the signal 402 from the edge detector 112 becomes high, i.e., when an edge is detected. In addition, the plurality of configurable registers 406, e.g., the first configurable register 122, the second configurable register 126, the third configurable register 130, the fourth configurable register 134, the fifth configurable register 138, the sixth configurable register 142, the seventh configurable register 146, and the eight configurable register 150 shown in FIG. 1, is filled with data from the pll_clk signal 164 after the edge is detected. The plurality of configurable registers is then emptied and filled with zeroes for the dead cycle. For example, the pll_clk signal 164 may have the bits "01111000" The configurable registers may each be filled with one of these bits. The registers are then emptied and filled with zeroes for the dead cycle seen in the pll_clk signal 164 following the active cycle. A clock signal 404 is constant through the variations seen in the other signals. Further, during the switch from the scan_enable signal 102 from low to high or high to low, the scan_clk signal 116 is inactive.

FIG. 5 illustrates a process 500 that may be utilized in the circuit configuration 100 shown in FIG. 1. At a process block 502, the process 500 emits a reconfigurable number of programmable at-speed phase-locked loop clock pulses without a dead cycle through an integrated circuit. Further, at a process block 504, the process 500 emits a plurality of programmable at-speed phase-locked loop clock pulses through the integrated circuit such that a reconfigurable number of dead cycles is between the plurality of programmable at-speed phase locked loop clock pulses. In addition, at a process block 506, the process 500 captures data associated with the reconfigurable number of programmable at-speed phase-locked loop clock pulses. Finally, at a process block 508, the process 500 captures data associated with the reconfigurable number of dead cycles.

While the apparatus and method have been described in terms of what are presently considered to be the most practical and preferred embodiments, it is to be understood that the disclosure need not be limited to the disclosed embodiments. It is intended to cover various modifications and similar arrangements included within the spirit and scope of the claims, the scope of which should be accorded the broadest interpretation so as to encompass all such modifications and similar structures. The present disclosure includes any and all embodiments of the following claims.

The invention claimed is:

1. An apparatus comprising:
   a PLL included in an integrated circuit for generating a first clock signal including pulses at a first frequency; and
   a controller for providing said first clock signal to a circuit within said integrated circuit during a first mode of operation, and for providing a second clock signal at a second frequency lower than said first frequency to said circuit within said integrated circuit during a second mode of operation and for providing a third clock signal having a first portion comprising a plurality of said pulses of said first clock signal at said first frequency and a second portion, wherein the second portion includes none of said pulses of said first clock signal and has a duration greater than a pulse width of said first clock signal.

2. The apparatus of claim 1, wherein a waveform of the third clock signal corresponds to a bit pattern stored in a register.

3. The apparatus of claim 1 wherein the third clock signal is generated in response to data associated with a reconfigurable number of programmable at-speed phase-locked loop clock pulses is stored in a configurable register.

4. The apparatus of claim 3, wherein the data associated with a reconfigurable number of programmable at-speed phase-locked loop clock pulses is stored in a dead cycle configurable load register.

5. The apparatus of claim 4, wherein the dead cycle configurable load register is utilized for multi-cycle paths and related clocks.

6. The apparatus of claim 4, wherein the dead cycle configurable load register is loaded with a scan chain.

7. The apparatus of claim 4, wherein the dead cycle configurable load register is controlled with input pins.

8. An integrated circuit comprising:
   a first register;
   a second register;
   a third register; and
   a controller for enabling transfer of data in parallel from said first register to said second register responsive to a first clock signal at a first frequency during a first mode of operation, and for enabling transfer of data in series from said first register to said second register responsive to a second clock signal at a second frequency during a second mode of operation, and for enabling transfer of data in parallel between said first register and said second register responsive to a third clock signal having a waveform corresponding to a bit pattern stored in said third register.

9. The integrated circuit of claim 8, wherein the bit pattern corresponds to data associated with a reconfigurable number of programmable at-speed phase-locked loop clock pulses is stored in a configurable register.

10. The integrated circuit of claim 9, wherein the data associated with a reconfigurable number of programmable at-speed phase-locked loop clock pulses is stored in a dead cycle configurable load register.

11. The integrated circuit of claim 10, wherein the dead cycle configurable load register is utilized for multi-cycle paths and related clocks.

12. The integrated circuit of claim 10, wherein the dead cycle configurable load register is loaded with a separate scan chain.

13. The integrated circuit of claim 10, wherein the dead cycle configurable load register is controlled with primary input pins.

14. A method comprising the steps of:
    receiving a bit pattern corresponding to a number of clock cycles, wherein said bit pattern represents a clock signal waveform;
    transferring data in parallel between a first register and a second register in a first mode of operation;
    transferring data in series between said first and said second register in a second mode of operation;
    transferring data in parallel between said first register and said second register for said number of clock cycles in said second mode of operation in response to a clock signal corresponding to said clock signal waveform; and
    transferring data in series between said first register and said second register in said second mode of operation.

15. The method of claim 14, wherein the bit pattern is stored in one or more configurable registers.

16. The method of claim 14, wherein the bit pattern is stored in a dead cycle configurable load register.

17. The method of claim 16, wherein the dead cycle configurable load register is utilized for multi-cycle paths and related clocks.

18. The method of claim 16, wherein the dead cycle configurable load register is loaded with a separate scan chain.

19. The method of claim 16, wherein the dead cycle configurable load register is controlled with primary input pins.

20. A method of testing an integrated circuit comprising the steps of:
    receiving a bit pattern corresponding to a number of clock cycles, wherein said bit pattern represents a clock signal waveform;
    storing said bit pattern in a first register;
    transferring data in parallel between a second register and a third register;
    receiving a command signal;
    transferring data in series between said second register and said third register in response to said command signal;
    stopping said serial transfer of data between the second register and the third register;
    transferring data in parallel between the second register and the third register for said number of clock cycles in response to a clock signal corresponding to said clock signal waveform; and
    resuming said serial transfer of data between the second register and the third register.

21. The method of claim 20, wherein the bit pattern is stored in a configurable register.

22. The method of claim 20, wherein the bit pattern is stored in a dead cycle configurable load register.

23. The method of claim 22, wherein the dead cycle configurable load register is utilized for multi-cycle paths and related clocks.

24. The method of claim 22, wherein the dead cycle configurable load register is loaded with a separate scan chain.

25. The method of claim 22, wherein the dead cycle configurable load register is controlled with primary input pins.

* * * * *